United States Patent [19]
Heeger et al.

[11] Patent Number: 5,804,836
[45] Date of Patent: Sep. 8, 1998

[54] SMART POLYMER IMAGE PROCESSOR

[75] Inventors: Alan J. Heeger, Santa Barbara; David Heeger, Palo Alto; John D. Langan, Santa Barbara, all of Calif.

[73] Assignee: Uniax Corporation, Santa Barbara, Calif.

[21] Appl. No.: 907,339

[22] Filed: Aug. 6, 1997

Related U.S. Application Data

[63] Continuation of Ser. No. 417,198, Apr. 5, 1995, abandoned.

[51] Int. Cl.$^6$ ..................................................... H01L 35/24
[52] U.S. Cl. ........................... 257/40; 257/103; 257/443; 257/448; 257/459; 257/457; 313/500
[58] Field of Search ............................. 257/40, 443, 448, 257/457, 459, 99, 103; 313/500

[56] References Cited

U.S. PATENT DOCUMENTS

| | | | |
|---|---|---|---|
| 4,769,292 | 9/1988 | Tang et al. | 313/504 |
| 5,005,667 | 4/1991 | Sayag | 358/213.31 |
| 5,189,136 | 2/1993 | Wudl et al. | 528/86 |
| 5,232,631 | 8/1993 | Cao et al. | 252/500 |
| 5,282,955 | 2/1994 | Leventis et al. | 205/317 |
| 5,563,424 | 10/1996 | Yang et al. | 257/40 |

OTHER PUBLICATIONS

Bozler C.O. "Current prospects for the permeable base transistor" *Surface Science* (1986) 174:487–500.
Tang et al. "Organic electroluminescent diodes" *Appl. Phys. Lett.* (1987) 51:913–915.
Tang et al. "Electroluminescence of doped organic thin films" *J. Appl. Phys.* (1989) 65:3610–3616.
Adachi et al. "Organic electroluminescent device having a hole conductor as an emitting layer" *Appl. Phys. Lett.* (1989) 55:1489–1491.
Nohara et al. "A new series of electroluminescent organic compounds" *Chemistry Letters* (1990) pp. 189–190.
Adachi et al. "Blue light–emitting organic electroluminescent devices" *Appl. Phys. Lett.* (1990) 56:799–801.
Mohammadi et al. "Conducting polymers prepared by template polymerization: polypyrrole" *Polymer* (1990) 31:395–399.
Burroughes et al. "Light–emitting diodes based on conjugated polymers" *Nature* (1990) 347:539–541.
Braun et al. "Visible light emission from semiconducting polymer diodes" *Appl. Phys. Lett.* (1991) 58:1982–1984.
Cao et al. "Counter–ion induced processibility of conducting polyaniline and of conducting polyblends of polyaniline in bulk" *Synthetic Metals* (1992) 48:91–97.
Cao et al. "Solution–cast films of polyaniline: Optical–quality transparent electrodes" *Appl. Phys. Lett.* (1992) 60:2711–2713.
Gustafsson et al. "Flexible light–emitting diodes made from soluble conducting polymers" *Nature* (1992) 357:477–479.
Yang et al. "Morphology of conductive, solution–processed blends of polyaniline and poly(methyl methacrylate)" *Synthetic Metals* (1993) 53:293–301.
Aratani et al. "Improved efficiency in polymer light–emitting diodes using air–stable electrodes" *Journal of Electronic Materials* (1993) 22:745–749.
Zhang et al. "Light–emitting diodes from partially conjugated poly(p–phenylene vinylene)" *J. Appl. Phys.* (1993) 73:5177–5180.

(List continued on next page.)

*Primary Examiner*—Minh-Loan Tran
*Attorney, Agent, or Firm*—Burns, Doane, Swecker & Mathis, L.L.P.

[57] ABSTRACT

A smart array comprised an array of polymer grid triodes arrayed with a common polymer grid. In a preferred embodiment it is embodied as a conducting polymer device which provides local gain adjustment for video display such that the entire sensor dynamic range available, typically more than 16 bits in the infrared detector case, can be utilized locally to solve the intra-scene contrast problem. The array of polymer grid triodes with common grid can be utilized to process the image in analog form directly on the focal plane. Alternatively, the array of polymer grid triodes with common grid can be utilized to process the image after analog to digital conversion and integrated directly into the display.

51 Claims, 4 Drawing Sheets

OTHER PUBLICATIONS

Reghu et al. "Superlocalization of the Electronic Wave Functions in Conductive Polymer Blends at Concentrations near the Percolation Threshold" *Macromolecules* (1993) 26:7245–7249.

Greenham et al. "Efficient light–emitting diodes based on polymers with high electron affinities" *Nature* (1993) 365:628–630.

Zhang et al. "Blue electroluminescent diodes utilizing blends of poly(p–phenylphenylene vinylene) in poly(9–vinylcarbazole)" *Synthetic Metals* (1994) 62:35–40.

Parker I.D. "Carrier tunneling and device characteristics in polymer light–emitting diodes" *J. of Appl. Phys.* (1994) 75:1656–1666.

Yang et al. "A new architecture for polymer transistors" *Nature* (1994) 372:344.

Garnier et al. "An All–Organic Soft Thin Film Transistor With Very High Carrier Mobility" *Adv. Mater.* (1990) 2:592.

Tomozawa et al. "Metal–Polymer Schottky Barriers on Cast Films of Soluble Poly(3–Alkylthiophenes)" *Synth. Met.* (1987) 22:63.

Tomozawa et al. "Metal–Polymer Schottky Barriers on Processible Polymers" *Synth. Met.* (1989) 28:C687.

Reghu et al. "Transport in Polyaniline Networks near the Percolation Threshold" *Phys. Rev. B* (1994) 50:13931.

Mead, C. *Analog VLSI and Neural Systems*, (Addison–Wesley, 1989) 3–9; 257–278.

Yang et al., "Polyaniline as a transparent electrode for polymer light emitting diodes . . . ", Appl. Phys. Lett. 64(10), Mar. 1994.

SMART POLYMER IMAGE PROCESSOR

This application is a continuation of application Ser. No. 08/417,198, filed Apr. 5, 1995, now abandoned.

FIELD OF THE INVENTION

This invention concerns solid state electrical devices, more particularly arrays of solid state electrical devices and their preferred applications as optical sensors and displays.

BACKGROUND OF THE INVENTION

There is a growing appreciation that nature has evolved biological operating principles and systems which are useful models for problem solving in complex electronic environments. (The book *Analog VLSI and Neural Systems,* by Carver Mead (Addison Wesley, 1989) describes numerous aspects of this approach.) An example of an electronic environment with complex issues may be found in the field of electronic optical sensors and displays. Here, the technology for sensing and displaying visual information has evolved to give ever-improving image detection and ever-more-life- like and detailed image depiction. As this has occurred, however, the quantity of information generated and requiring processing has increased to an even greater degree. This vast volume of digital information poses a significant computational bottleneck.

Conventional electronic solutions which have been applied to this problem have focussed on simplifying matters at the level of electronic components so as to cope with the binary data volume and complexity while at the same time trying to provide speed, reproducibility and accuracy. These solutions appear to be limited in effectiveness.

In contrast to these classical electronic device approaches to visual image processing, during the course of evolution, complex living organisms learned important lessons when faced with the same problems associated with digesting the huge amount of visual information needed to form useful representations of the outside world. Nature made spectacular use of this opportunity. Nature chose an architecture of massive parallelism, used in retinal preprocessing, that is fault tolerant of component variation and point failure yet gives a result that is astoundingly fast, low in power consumption, and eclipses the largest and fastest supercomputers. For certain problems in electronics, like arrayed sensors, a balance of such biological organizing principals of computational parallelism on and off the focal plane could provide desirable results.

The present invention provides electronic devices which employ biologically-modelled structures and solutions in contrast to the approaches implemented heretofore and thus achieve to an extent a range of advantages over prior devices.

One example of a problem that has not lent itself to easy solution in conventional electronic devices but which does offer opportunities for solution through application of these new design principals concerns the local adjustment of contrast in electronically sensed or displayed optical images.

The basic problem to be solved is well-known. For example, when a human views a brightly lighted external scene through a window from inside a poorly lighted room, the individual has no difficulty seeing, simultaneously, the details of both the internal scene and the external scene. This is done by local contrast control; the visual system locally adjusts the gain using what is termed "lateral inhibition of response." (Carver Mead, supra.)

Equivalent electronic devices of the prior art have not been able to achieve this sophistication. Prior art devices have globally adjusted brightness or contrast. This has the effect of thresholding out the weak elements of the scene and/or saturating the stronger ones. Adjusting the gain so as to avoid either extreme can be done but this necessarily washes out the local contrast differences.

To make the shortcomings of prior devices more clear, consider the three pictures of Dr. Einstein in FIGS. 1, 2 and 3. FIG. 1 is the actual image stored in digital form in a computer and then printed with all the detail that one needs to see that it is indeed Dr. Einstein and to see clearly all the features of the scene. FIG. 1 is an 8 bit image. In FIG. 2, the same image has been multiplied by a ramp of intensity (smoothly increasing from 1 on his right to 256 on his left) and then divided by 256. FIG. 2 is thus a 16 bit image, but displayed as an 8 bit image (analogous to a video display). All the information in FIG. 1 is in FIG. 2, however, that information cannot be clearly seen on the limited range display. In FIG. 3, the same image as in FIG. 1, has been multiplied by a rounded step function (increasing as a step from 1 on his left to 256 on his right) and then divided by 256. The image in FIG. 3 is like that which would result if Dr. Einstein were illuminated from his right by a very bright spot light. Although all the information in FIG. 1 is again in FIG. 3, his right side cannot be seen on the limited range display. What is needed to preserve the full range of sensor information and thereby make it accessible to the viewer is local contrast control.

A desirable solution would provide an electronic device capable of local contrast control in much the same way as in mammalian vision, using lateral inhibition of response as described in general terms in Analog VLSI and inhibition of response. One approach to this process is proposed in chapter 15 "Silicon Retina" written by M. A. Mahowald and Carver Mead in *Analog VLSI and Neural Systems,* by Carver Mead (supra) for "wet" biology horizontal cells and in a "silicon retina" implementation. This method involves a combination of logarithmic compression and lateral inhibition of response, where the lateral inhibition of response is provided by a horizontal resistive network (a "neural network"). The mathematics of this approach can be simply described. By using logarithmic compression, the output from a given pixel ($V_i$) is proportional to the log of the intensity ($I_i$) of that pixel:

$$V_i = V_o \log I_i \tag{1}$$

The lateral inhibition of response is implemented by subtracting from $V_i$ the average output from surrounding pixels over a specific range; thus, the renormalized image is defined by $$v_i = V_o \log I_i - <V_o \log I_i>_{avc} = V_o \log I_i - (V_o/N)\Sigma_i \log I_i \tag{2}$$

where the sum is over the pixels within the averaging range (the center surround or blurring range). Eqn 2 is equivalent to $$v_i = V_o \log \left[ \frac{I_i}{(\Pi I_i)^{1/N}} \right] \tag{3}$$

The denominator is the geometric mean. The input-output relationship generalizes in the obvious way, to allow for a weighted sum (blurring) by replacing $1/N$ by $w_i$ where $w_i$ are the weights.

Eqn 3 (and its generalization) is the mathematical expression which defines the logarithmic local contrast enhancement algorithm.

While this problem has been defined in terms of a specific set of problems in a particular video sensor/display setting, it will be readily appreciated that the general concept of using a biologically-modelled solution of interrelated nodes to complex problems presents similar opportunities in other areas of data acquisition, processing and use and that the present invention has application throughout these many areas.

As further background, three recent United States patent applications (U.S. Ser. Nos. 08/218,321; 08/227,979 and 08/292,817 now U.S. Pat. No. 5,563,424 filed on Mar. 24, 1994, Apr. 15, 1994 and Aug. 10, 1994 respectively) each describe the concept of a polymer grid triode (or "PGT") and its application in photovoltaic cells and light emitting diodes.

Statement of the Invention

It is a fundamental object of this invention to overcome the limitations and disadvantages of the prior art and to provide a desirable degree of interrelationship among adjacent nodes in electronic array devices such as photo detector arrays and display arrays. This object is met by employing an array in which the individual nodes are polymer grid triodes and in which adjacent nodes are interconnected by a common polymer grid. This arrangement leads to smart arrays, that is arrays in which the individual nodes are each independent to a substantial degree but also are capable of having a variable degree of dependence upon adjacent nodes.

Thus, in one aspect, the invention can achieve retinal focal plane contrast adjustment for multiple node displays and detectors by providing a conducting polymer implementation of the horizontal resistive network. As such an array of polymer grid triodes is provided with a common grid serving as the horizontal resistive network and interrelating the several nodes. This gives rise to a "smart polymer focal plane image processor" or "SPFPIP".

An array of polymer grid triodes with a common grid can be utilized, in an alternative aspect of the invention, as a "smart polymer digital image processor" of "SPDIP"; a device which will provide local gain adjustment for video display, after analog-to-digital conversion; said SPDIP is integrated directly into the display with the output from the array of PGT's with common grid as input to the pixels of the display. Again, the smart polymer digital image processor enables the entire dynamic range available from the camera or detector to be presented on a display with limited range.

It is an additional aspect of the present invention to use polymer grid triodes and arrays of polymer grid triodes with common grid in neural network applications where the common grid serves to provide the horizontal resistance network called for in these networks.

In one aspect of this invention, arrays of polymer grid triodes comprising a common grid in which the active layer, one of the semiconducting layers is a higher resistance conducting polymer with sufficiently high conductivity to form an ohmic contact with the grid electrode; i.e. for which the equivalent circuit is that of a diode in series with a resistor.

In another aspect, the spatial decay length exhibited by the array of polymer grid triodes comprising a common grid is controlled by varying the sheet resistance of the conducting polymer which forms the common grid. "Spatial decay length" is a characteristic of an array of nodes interconnected by a resistive network. It refers to the distance (or indirectly the number of nodes encompassed by the distance) in which nodes are significantly interrelated by the resistive network.

In another aspect, the spatial decay length within the array of polymer grid triodes having a common grid is controlled by varying the thickness and the resistivity of resistive layer.

In yet an additional aspect, the spatial decay length within the array of polymer grid triodes having a common grid is controlled by varying the sheet resistance of the conducting polymer by forming a blend of the conductive polymer with a suitable host polymer, this blend having an electrical resistivity which is a function of the concentration of conducting polymer in the blend.

In yet an additional aspect, the spatial decay length within the array of polymer grid triodes having a common grid is varied in situ by replacing the resistive layer with a bilayer which functions as a diode so as to vary the conductance of the "resistive layer" over a wide range.

Thus, the present invention can be embodied as a triode array. This array has either a common first electrode or a plurality of first electrodes and a plurality of second electrodes. The plurality of second electrodes are spatially arrayed and electrically-isolated from one another as are the plurality of first electrodes, if present. The first electrode(s) and the second electrodes are spaced apart from one another by solid semiconductor with a common polymer grid made up of a body of electrically-conducting organic polymer having an open and porous network morphology and defining an expanded surface area void-defining porous network present in the semiconductor and interposed between the first electrode(s) and the second electrodes. Additional layers may be present in this array. For example, these can be a layer of active electronic material between the polymer grid and either or both of the first and second electrodes. Active electronic material can also be present in the voids defined by the open and porous network of the polymer grid body.

In additional embodiments these triode arrays can be configured with a layer of active electronic material in electrical contact with at least a substantial portion of the surface of the first electrode(s) and between this electrode and the polymer grid and/or with a layer of active electronic material in electrical contact with at least a substantial portion of the surface of the second electrodes and between the polymer grid and the second electrodes with at least one of these one or more layers of active electronic material being a high conductivity active layer having a conductivity high enough to constitute an ohmic contact between the polymer grid and the adjacent electrode and thereby give rise to a circuit equivalent to a diode in series with a resistor.

In a particular application this invention can be embodied as a light-emitting triode array which includes at least one and usually a plurality of first electrodes spatially arrayed and electronically isolated from one another over a surface having a length and width and a plurality of second electrodes spatially arrayed and electronically isolated from one another. These first electrodes and second electrodes are spaced apart from one another with a polymer grid which includes a body of electrically conducting organic polymer. This body has an open and porous network morphology and defines an expanded surface area void-defining porous network interposed between the first electrodes and the second electrodes. These arrays include an electroluminescent semiconducting material between the first and second electrodes so that when an effective turn-on voltage is applied across one or more of the first electrodes and one or more of the second electrodes, charge carries are injected into the electroluminescent semiconducting material in those regions therebetween and light is emitted from those regions.

In an additional embodiment, this invention can take the form of an electronic neural simulation network which includes a plurality of nodes in an array with a horizontal resistance network among the plurality of nodes. This structure can be achieved with any of the configurations set forth herein with the polymer grid supplying the horizontal resistance network.

In yet a further embodiment this invention can be embodied as an image processor which comprises a plurality of optical sensors spatially arrayed over an area upon which the image is projected thereby giving rise to different electrical outputs from the members of the plurality of optical sensors depending upon the light intensity of the image. In this embodiment the polymer grid provides local gain adjustment and local contrast control. Similarly, the array, in any of the configurations just described, can be embodied as an optical image display in which the polymer grid also provides local gain adjustment and local contrast control.

Alternatively the invention can be embodied as a method for varying the spatial decay characteristic of a neural network. This variance of spatial decay characteristics can be achieved by varying the resistance of the polymer grid. This can be accomplished by changing the material of the polymer grid and/or by changing the thickness of the polymer grid.

Additional objects, advantages and novel features of this invention will be set forth in part in the description which follows, and in part will become apparent to those skilled in the art on examination of the following, and may be learned by practice of the invention.

DETAILED DESCRIPTION OF THE INVENTION

BRIEF DESCRIPTION OF THE DRAWINGS

This invention will be described with reference being made to the drawings in which:

FIG. 2 is thus a 16 bit image, but displayed as an 8 bit image.

DESCRIPTION OF PREFERRED EMBODIMENTS OF THE INVENTION

Thin film solid state triodes have been fabricated from conducting polymers by processing the active layers from solution (U.S. patent application Ser. Nos. 08/218,321; 08/227,979 and 08/292,817 now U.S. Pat. No. 5,563,424 and Y. Yang and A. J. Heeger, Nature, 372, 244(1994), all of which are incorporated herein by reference). In these polymer grid triodes (PGTs), the third electrode, analogous to the grid in a vacuum tube triode, is an open network of a conductive polymer such as polyaniline, "PANI", protonated to the highly conducting form such as with camphor sulfonic acid (CSA). Semiconducting polymer forms a layer between the anode and the polymer grid, and between the polymer grid and the cathode, and at least partially fills the void spaces within the porous conductive polymer network.

Figure 4:
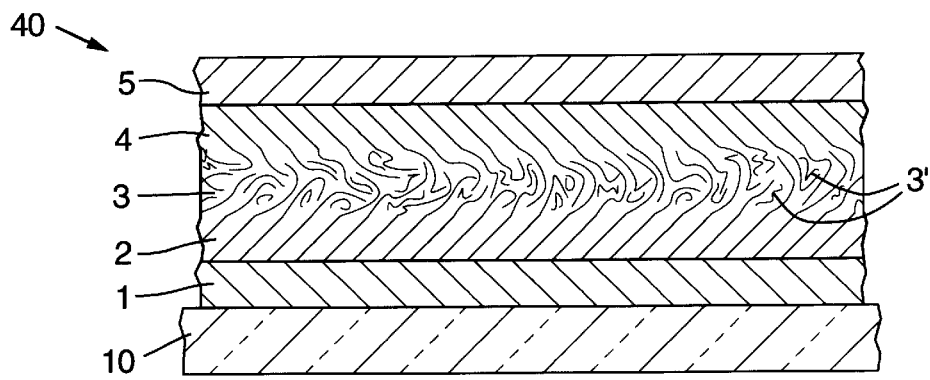
FIG. 4 is a schematic cross-section (not to scale) of the structure of a polymer grid triode which can serve as a node in the arrays of this invention.

A representative PGT structure with polymer grid electrode is depicted as 40 in FIG. 4, with the various constituents labeled as 1 through 5. A first electrode 1, shown on a substrate or support 10, is in contact with a layer 2 of semiconducting polymer, the top of which is in contact with the conductive polymer grid electrode 3. This polymer grid 3 is typically filled (or partially filled) with semiconducting polymer 3'. The top of the grid electrode 3 is again in contact with a layer 4 of semiconducting polymer, which is in contact with a second electrode 5. The first and second electrodes, 1 and 5, in either order, are the anode and/or cathode. The first, second and third layers of semiconducting polymer, 2, 3' and 4, respectively (all of which can be the same) serve to transport electronic charge carriers through the structure. The current due to these charge carriers is controlled by the polymer grid electrode 3.

The polymer grid triodes can be either single-carrier or two-carrier devices. For single-carrier devices, carriers are injected at one electrode and withdrawn at the second electrode; for example, holes are injected into otherwise filled energy states of the semiconducting material at the anode and withdrawn at the cathode. For two-carrier polymer grid triodes, holes are injected into otherwise filled energy states of the semiconducting material at the anode, and electrons are injected into otherwise empty energy states at higher energy at the second electrode. For a description and analysis of one-carrier and two-carrier injection, see I. D. Parker, J. Appl. Phys., 75. 1656 (1994).

As shown in FIG. 4, the nodes within the arrays of polymer include electrodes 1 and 5 which serve interchangeably as anode and cathode. The anode serves as a hole injecting and/or electron withdrawing contact; and is therefore formed of a conducting material with relatively high work function (relatively high ionization potential). The cathode serves as an electron-injecting and/or hole-withdrawing contact; for example, a relatively low work function metal (Ca, Al, or the like) in the case of two-carrier devices, or metals such as gold, copper or silver for the case of single-carrier, hole-only devices.

Single-carrier devices are useful and indeed often preferable for polymer grid triode nodes, for in this case, one can use stable metals such as, for example, copper or silver as the cathode (and hole withdrawing) material.

In the case of two-carrier light-emitting or light detecting triodes, one of the two electrodes (typically the anode) is at least semi-transparent so as to enable the light to enter or exit from the device. Examples of suitable transparent electrodes are indium/tin-oxide (ITO) and polyaniline (PANI) in the conducting, protonated emeraldine salt form. In two-carrier devices, the cathode is typically a relatively low work function conducting material. Any low work function (low ionization potential) conducting material can be used as the electron injecting contact; for example a conventional metal, a metal alloy or an electropositive conducting polymer such as, for example, polyquinoline. The electropositive and electronegative character of the electrodes can be defined with respect to the semiconducting material within the polymer grid triode by standard electrochemical means.

ITO has been the most commonly used transparent electrode for EL devices. On the other hand, PANI, in the emeraldine salt form prepared according to U.S. Pat. No. 5,232,631, U.S. patent application Ser. Nos. 07/800,555 and 07/800,559, and in Applied Physics Letters, 60, 2711 (1992), has a higher work function than ITO, and therefore provides better hole injection into the polymer active layer. However, the surface resistance of a very thin PANI film often is too high for some applications. In order to avoid significant voltage drop in the electrode, it is desirable to decrease the surface resistance of the anode to less than about 100 ohms/square. Although this can be achieved using a thicker layer (>2500 Å) of PANI, the transmittance of such a PANI electrode is less than 70%, which would lead to more than a 30% loss in external quantum efficiency. United States patent application Ser. No. Applied Physics Letters 64, 1245 (1994) disclosed that when an ITO electrode is coated with an ultrathin layer (typically <1000 Å) of PANI, the bilayer electrode thus obtained has a minimum transmittance (~500 nm) at around 90%, a work function similar to that of PANI alone and a surface resistance below that of ITO. The bilayer PANI/ITO electrode offers special advantages for use in electroactive devices with improved efficiency and lower operating voltages.

The polymer grid triodes which constitute the nodes in the arrays of the present invention include and are joined together electrically by a common polymer grid 3.

In many embodiments the grid electrode 3 is a high surface area porous, but electrically substantially continuous, network made up of conducting polymer. The high surface area and porosity is reflected in a surface area of at least about 10 cm²/gram, such as at least 25 and often at least 50 or even 100 cm²/gram and porosity values of at least about 1%, especially at least about 5%, and often at least about 25%. In certain other embodiments, the grid needs not be porous.

As has been previously demonstrated, polyaniline, PANI, self-assembles into a conducting network morphology in blends with poly(methylmethacrylate) (C. Y. Yang, Y. Cao, P. Smith and A. J. Heeger, Synth. Met. 53, 293 (1993)). The network is fractal with a very high surface area at the PANI:host interface (Reghu Menon, C. O. Yoon, C. Y. Yang, D. Moses and A. J. Heeger, Macromolecules, 26, 7245 (1994)). The connected pathways in the PANI-CSA network cause such blends to exhibit electrical conductivity with values in excess of 1 S/cm at volume fractions of only a few per cent (w/w) PANI-CSA where CSA denotes camphor sulfonic acid. After selectively etching out the host polymer, the remaining conducting PANI-CSA network is rough and porous, and has a high surface area. This high surface area, porous network can be used for the polymer grid electrode 3. In this way, the contact area between the PANI-CSA and the active material 3' which fills the porous network can be increased dramatically.

Polyaniline is one class of material useful in forming grid 3 in the arrays of this invention. The exact polyaniline employed may vary widely and is not critical. Useful conductive polyanilines include the homopolymer, derivatives and blends with bulk polymers, which herein are collectively referred to as PANI. Examples of PANI are those disclosed in U.S. Pat. No. 5,232,631, which is incorporated by reference herein. Preferred PANI has a bulk conductivity of at least $10^{-3}$ S/cm. More preferred PANI has a bulk conductivity of at least $10^{-1}$ S/cm. Still more preferred PANI has a bulk conductivity of at least 1 S/cm. Most preferred PANI has a bulk conductivity of at least 100 S/cm.

Other network-forming conducting materials can be used in place of PANI. For example, conductive forms of polypyrrole can be polymerized within a porous matrix polymer (A. Mohammadi, I. Lundstrom, O. Inganas and W. R. Salaneck, Polymer, 31, 395 (1990)).

The method by which the conducting network 3 is formed is not critical. Although any network-forming material can be used, the ability to create the network spontaneously through self-assembly, as is the case for PANI, offers a special advantage to the fabrication of polymer grid triodes.

In one embodiment for forming a grid 3, the metallic emeraldine salt form of PANI is prepared by protonation with functionalized sulfonic acids (e.g. CSA), yielding a conducting PANI-complex which is soluble in common organic solvents (Y. Cao, G. M. Tracy, P. Smith and A. J. Heeger, Appl. Phys. Lett. 60, 2711(1992). Y. Cao, P. Smith and A. J. Heeger, Synth. Met. 48, 91 (1992)). PANI-CSA solutions (2%, w/w) can be prepared using meta-cresol as the solvent. A highly soluble low molecular weight ($M_w$<10,000) polyester resin, PES, can be admixed with the PANI; the PES being separately dissolved in meta-cresol at a concentration of 20% w/w. Different concentrations of PANI:PES blends can be prepared by mixing the PANI and PES solutions at different ratios and concentration in order to optimize the effects of high surface area and surface roughness. The PANI:PES blends can be spin-cast onto glass substrates 10 (coated with electrode 1 and active layer 2) and subsequently dried in air at 50° C. for 12 hours. Subsequently, the PES can be removed from the blend by exposing the PANI:PES blend thin film to a solvent which dissolves only the PES, leaving the conducting PANI network open, porous, and intact.

The materials chosen as conductive polymers for forming the layers of active electronic materials for elements 2, 3' and 4 play a role in determining the characteristics and performance of the arrays of triodes. For example, if one or more of the active electronic materials are luminescent, a light-emitting polymer grid triodes can be achieved. Similarly, if a photoactive material is employed, a multinode detector can be achieved.

A wide variety of semiconducting and/or luminescent materials well known in the art can be used as layers 2 and 4 and as 3' to fill, or partially fill, open void spaces within the porous network. These include inorganic semiconductors such as silicon and especially amorphous silicon (deposited for example by chemical vapor deposition, CVD), semiconducting organic polymers, both conjugated and nonconjugated, and blends of conjugated polymers in host polymers, small molecule organic semiconductors and the like.

Examples of semiconducting conjugated polymers include but are not limited to poly(phenylenevinylene), PPV, and soluble derivatives of PPV, such as MEH-PPV (U.S. Pat. No. 5,189,136) and BCHA-PPV (U.S. patent application Ser. No. 07/626,463 now U.S. Pat. No. 5,189,136), PPPV (C. Zhang et al, Synth. Met. 62, 35, (1994) and references therein) and the like, the soluble derivatives of polythiophene, for example the poly(3-alkylthiophenes) (C. Zhang et al, J. Appl. Phys. 73, 5177, (1993)) and other semiconducting conjugated polymers, some of which exhibit photoluminescence; and blends of such semiconducting and/or luminescent conjugated polymers in hole-transporting or electron transporting polymers (C. Zhang et al, Synth. Met. 62, 35, (1994)).

Small molecule semiconducting and/or luminescent organic materials can be used, such as those disclosed in the following: (C. W. Tang, S. A. Van Syke, Appl. Phys. Lett. 51, 913 (1987); C. W. Tang, S. A. Van Syke and C. H. Chen, J. Appl. Phys. 65, 3610 (1989); C. W. Tang, S. A. Van Syke, U.S. Pat. No. 4,769,292; C. Adachi, S. Tokito, T. Tetsui and S. Saito, Appl. Phys. Lett. 55, 1489 (1989); C. Adachi, S. Tokito, T. Tetsui and S. Saito, Appl. Phys. Lett. 56, 799 (1989); M. Nohara, M. Hasegawa, C. Hosohawa, H. Tokailin, T. Kusomoto, Chem. Lett. 189 (1990)).

In the case of small molecule semiconducting and luminescent organic materials, the material is sublimed (vacuum evaporation) and deposited directly into the open voids of the pre-formed porous network. Oligomers of thiophene, for example, comprising four, five or six thiophene rings, are known in the prior art and have been sublimed to form thin films for use in FETs (F. Garnier, G. Horowitz, X. Peng, and D. Fichou, Adv. Mater. 2, 592 (1990)).

Inorganic semiconductors can be used, a requirement being that such inorganic semiconductors be deposited by a sufficiently low temperature process that the network is not adversely affected. For example, CVD methods can be used to deposit inorganic semiconducting material into the open voids within the porous network.

In the case of semiconducting polymer materials, the active semiconducting (and luminescent, when appropriate) material may be cast from solution into the open void spaces within the porous network. In this case, the semiconducting material must be in solution in a solvent which does not dissolve the conducting network material. Alternatively, the active electronic material might be vapor deposited into the voids.

Typical film thicknesses for the network grid electrode filled with semiconductive material range from a few hundred Angstrom units to a few thousand Angstrom units (1 Angstrom unit=$10^{-8}$ cm). Although the active film thicknesses are not critical, polymer grid triode performance can typically be improved by using thinner networks.

Since there is a continuous path of conducting materials between the electrodes 1 and 5 and through the polymer network grid electrode 3, this configuration, shown in FIG. 4, is that of a polymer grid triode. Also, since the distance between the first and second electrodes 1 and 5 is set by the thickness of the layers in a vertical configuration, sub-micron dimensions are easily achieved by fabricating 1 through 5 in the form of thin films.

Figure 5:
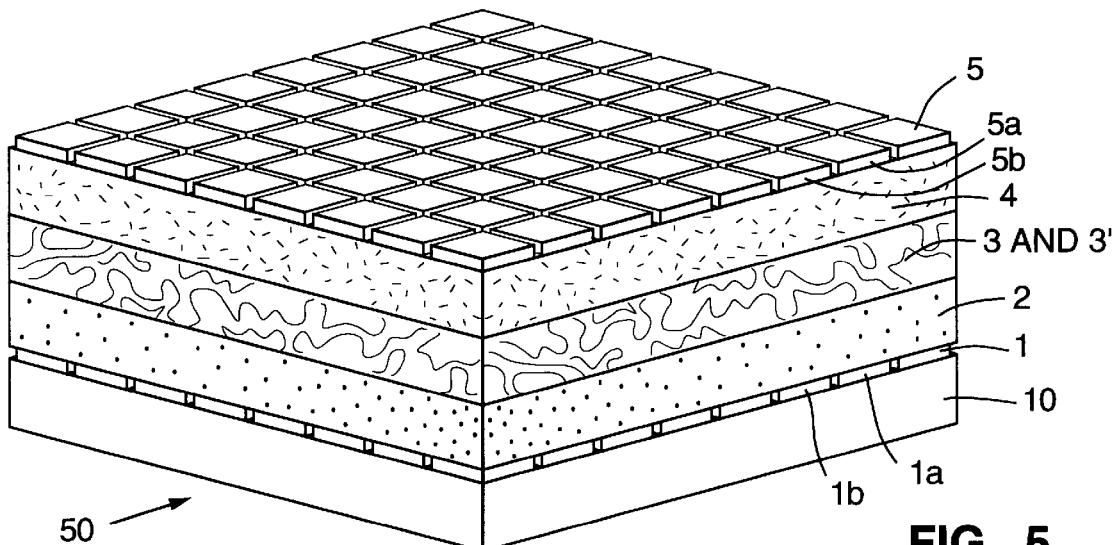
FIG. 5 is a perspective schematic diagram of an array of polymer grid triodes with a common grid.

The use of the polymer grid triode in directly implementing the local contrast enhancement algorithm (Eqn 3) is based on the structure shown schematically as 50 in FIG. 5 as an array of PGTs with a common grid. This array again includes a substrate 10 with a plurality of first electrodes 1, 1a, 1b, etc spread over its surface. These electrodes are essentially coplanar but separated from one another electrically. Next appears a layer 2 of electroactive material followed by the common grid 3 usually filled with electroactive material 3' and followed by a second layer of electroactive material 4 and a series of second electrodes 5, 5a, 5b, etc, again spaced from one another and electrically isolated from one another. In an embodiment not shown, either one of electrodes 1 or 5 may be continuous, although this is typically not preferred in most of the applications of these arrays.

The presence of the common grid 3 in this structure 50 enables the PGT structure to function as a neural network device; for example as a smart polymer image processor.

Depending upon the nature of the various elements in the PGT nodes of this array 50, the equivalent electrical circuit can be that of two coupled diodes connected back to back, as demonstrated in Y. Yang and A. J. Heeger, Nature 372, 244 (1994). This circuit is achieved by using semiconducting polymer as the active material in layers 2, 3' and 4.

By replacing the material in one of the layers 2 or 4 with a resistive material but one having sufficient conductivity to make an ohmic contact to the polymer grid, the circuit equivalent of the PGT is simplified to a diode in series with a resistor.

For the resistive material in the series resistor layer, one can use a wide range of conducting polymers or conducting polymer blends (such as blends of polyaniline). As shown in array 60 depicted in FIG. 6, in one configuration, polyvinylcarbazole (PVK) can be used as the series resistor layer 2. Note that this form of the polymer grid triode does not require that the carriers pass through an open grid 3. In this form of the PGT, the grid 3 can be a thin, continuous layer of conducting material, or it can be an open grid, if desired.

Figure 6:
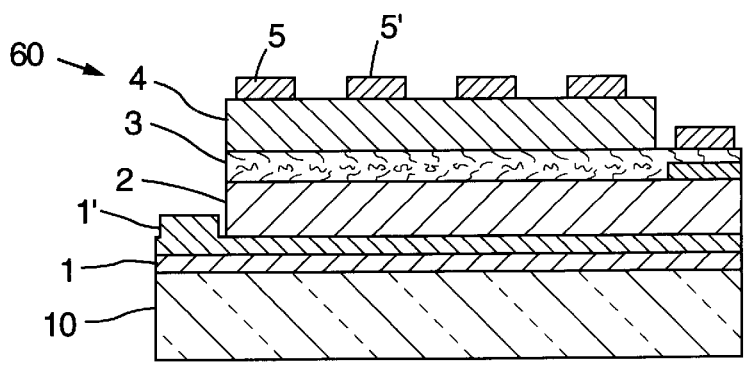
FIG. 6 is a simplified cross-sectional view of a polymer grid triode which operates as a diode in series with a resistor.

As also shown in FIG. 6, for certain applications it is useful to replace the resistive layer 2 described in the previous paragraph with a voltage-controlled resistive bilayer made up of layers 1' plus 2. The voltage controlled resistive bilayer can be implemented, for example, by a bilayer polymer diode. Such diodes are well known in the art; see for example, U.S. patent application Ser. Nos. 08/218,321; 08/227,979 and 08/292,817 now U.S. Pat. No. 5,563,424; I. D. Parker, J. Appl. Phys. 75, 1656 (1994); H. Tomozawa et al, Synth. Met., 22, 63 (1987); H. Tomozawa et al, Synth. Met. 28, C687 (1989)., and Y. Yang and A. J. Heeger, Nature 372, 244 (1994). A polymer diode can be made by casting a thin film of a conducting polymer with one or two higher conductivity contacts, such as metallic or metallic-acting contact layers. Examples of these multilayer resistive layers include, but are not limited to, MEH/Al, PANI-CSA/MEH-PPV/Ca, PANI-CSA/MEH-PPV/Al, and ITO/P3AT/Au, where P3AT denotes one of the poly(3-alkylthiophenes).

Since the current through a diode increases exponentially with forward bias, I $\alpha$exp [$\gamma$V] (where $\gamma$ is a constant), the resistance of such a polymer diode bilayer decreases as exp[$-\gamma$V]. Thus by using a polymer diode bilayer (2 plus 2' of FIG. 6) in place of the layer 2 in FIG. 4, one achieves voltage control of the resistance of the series resistance, thereby controlling the characteristic spatial decay length, or "blurring length", described in Eqn 7 (below).

For the three terminal device which is equivalent to a diode in series with a resistor, the principal requirement of the "grid" material for layer 3 is that it have sheet resistance at the desired level as described by equation (7), below. The current through this form of the PGT (I) is a function of the applied voltage ($V_A$) and the grid voltage ($V_G$). Under forward bias $$I = I_o \exp[\gamma(V_A - V_G)] + (V_A - V_G)/R_i + V_G/R_s \quad (4)$$

where $\gamma$ is a constant [I. D. Parker, J. Appl. Phys. 75, 1656 (1994)], $R_i$ is the internal series resistance of the diode (due to the bulk resistivity of the semiconducting material used in layer 4) and $R_s$ is the series resistance resulting from the series resistor layer, 2, or 2 plus 2'.

The semiconducting layer 4 in FIG. 6 can be fabricated from a high resistivity, pure semiconducting polymer such as poly(phenylene vinylene), PPV or one of its soluble derivatives, so that $R_s \ll R_i$. In this case, for example, the output of the PGT is a function of ($V_A - V_G$) only.

$$I = I_o \exp[\gamma(V_A - V_G)] + (V_A - V_G)/R_i \quad (5a)$$

$$I = F(V_A - V_G) \quad (5b)$$

As demonstrated in Example 1, Eqn 5 can be implemented in the form of a thin film common grid polymer grid triode shown schematically in FIG. 6.

Specific advantages of this invention over the prior art include the following:

The smart polymer image processor differs fundamentally from those of the prior art built with discrete silicon FETs. (C. Mead, Analog VLSI and Neural Systems, supra.) The smart polymer image processor makes use of the spreading resistance of the polymer control grid network in the PGT architecture to provide sufficient design adjustable interconnection of a given node with its neighbors. The finite conductivity of the conductive polymer grid network allows local self-bias of the control grid by its neighbors; the polymer network grid interconnects corresponding elements in each of the unit cells. This allows the center surround response from the grid bias as a result of lateral charge redistribution initiated by contrast differences.

Leakage to greater than nearest neighbors is not a problem and is in fact desirable in that the spreading resistance provides a natural averaging. Thus, with the common grid polymer grid array technology, the entire process can be laterally planar with contacts from the cathode an anode of the polymer grid triode above and below the structure. Furthermore, the basic design allows separating the polymer network between unit cells for complete isolation, if this were required for specific applications.

Thus, the common grid polymer grid triode array technology enables the relatively simple fabrication of the smart polymer image processor for implementation either directly on the focal plane (as a smart polymer focal plane image processor) or as a separate device, located off the focal plane with input after analog-to-digital conversion (as a smart polymer digital image processor and integrated directly into the display.) The smart polymer focal plane image processor combines both the series resistance for detector open circuit operation (which results in direct logarithmic compression) and horizontal current aggregation from the common grid interconnection, a continuous analog of the discrete approach of Mead (C. Mead, supra), with a variety of fabrication advantages.

In the smart polymer digital image processor application, the common grid polymer grid triode array is a separate device fabricated on, and an integral part of the display. The analog output from the detector array is first converted to digital form, the digital data are logarithmically compressed, and the logarithmically compressed data are in-put into the common grid polymer grid triode array to process the image; the output from the pixels of the array of polymer grid triodes is the input to the pixels of the display. Again, the purpose is to provide local gain control such that the entire available sensor dynamic range can used on a limited range display.

As shown in Example 1 and in FIG. 6, the fabrication of common polymer grid arrays is straightforward and basically involves sequentially laying down the series of separate layers which make up the device. For example (i) A thin resistive layer (1000 Å), for example, fabricated from PVK is put down as the first layer on a previously laid down layer of first electrodes on a substrate;

(ii) The polymer grid network ($\approx$1000 Å) is deposited usually as a blend as the second layer;

(iii) A final semiconducting polymer layer (for example, made of MEH PPV or another higher mobility polymer) is deposited to fill the porous PANI network and overlay the network grid. Thereafter second electrodes are deposited onto the final semiconducting polymer layer.

The resulting structure utilizes local bias of the polymer grid electrode to give the desired self-adapted lateral grid control of the array of PGTs, yet provides sufficient isolation to the individual nodes to realize the resistive network configuration envisioned by Mead. Since the entire structure has a thickness of only a few thousand Angstrom units, precise registry and alignment of anode and cathode contact pads are not critical to device operation, an additional important advantage.

The fabrication of such a structure is far simpler than that required to realize the resistive network using conventional discrete silicon FETs. The discrete FET approach involves a complicated topological and "real estate" limited layout problem since actually each lateral interconnection between nearest neighbors involves a number of FETs [see, for example, Mead's horizontal aggregating circuit; C. Mead, Analog VLSI and Neural Systems (Addison-Wesley, 1989)]. The PGT innovation provides a simple, manufacturable implementation of the horizontal resistive layer as well as simultaneous logarithmic compression of detector output on the top of the detector array with contact pads located in each unit cell for "bump bonding"; i.e. for direct contact to external circuitry. From the point of view of fabrication of the common grid polymer grid triode array, this surface can be prepared using normal photolithography techniques, without the necessity for lateral feature delineation, to appear planar for easy spin-on or other processing techniques.

Alternatively, the common grid polymer grid triode array can be integrated into the display as a "layer" between the addressable circuitry and the pixels of the display. For example, the liquid crystal display (LCD), utilizes the common grid polymer grid triode as both substrate and as input.

Consider, for example, a 1024×1024 pixel array. On a 50 $\mu$m pitch, the structure would be 5 cm on a side since 50 $\mu$m would be required to implement the FET approach. This would be both impractical for focal plane configurations and very costly. However, a 10 $\mu$m pitch using the continuous PGT approach could be implemented with relative simplicity yielding a 1 cm×1 cm chip.

It is instructive to examine the effective computation rates involved for various sized formats. For a 640×480 pixel array at 60 Hz the read-out rate is $1.8 \times 10^7$ MHz. For a 1024×1024 at 60 Hz it is $6.3 \times 10^7$ MHz. For this latter case, if each cell were coupled to 100 neighbors with ten operations per pixel to convert, we would have $6 \times 10^{10}$ operations per sec before any pre-filtering (which would probably add another 10× to the rate). This is well within the supercomputer range. However, by using the smart polymer focal plane image processor approach, this can be done with a single non-patterned layer, easily applied in a manner which is integral to detector array fabrication, that would be relatively inexpensive yet provide the required speed of operation.

Consider, then, the array of PGTs with common grid shown in FIG. 5. Assume, for simplicity, that the common grid is grounded at infinity. If the grid were not connected to the neighboring PGTs in the array, the voltage on the floating grid at any pixel would be proportional to the input voltage ($V_A$) at that pixel; i.e. $V_G = \beta V_A$. By utilizing the common grid, $$V_G = \beta <V_A>_{svc} \qquad (6)$$

where $<V_A>_{svc}$ denotes the average over neighboring pixels with a distance determined by the sheet resistance of the grid and the conductance to ground of the PVK layer. As shown by Mead (C. Mead, supra) the characteristic spatial decay length or "blurring length" over which the average is taken is given by $$L = 1/[\rho\sigma]^{1/2} \qquad (7)$$

where $\rho$ is the sheet resistance of the polymer network grid, and $\sigma$ is the conductance per unit area to ground of the resistive layer.

From this it follows that the output from each pixel of the array ($I_i$) is given by $$I_i = F[V_A^{(i)} - \beta <V_A>_{avc}] \qquad (8)$$

that is, $I_i$ is a function of the quantity $[V_A^{(i)} - \beta <V_A>_{svc}]$ only. Expanding, $$I_i \approx [V_A^{(i)} - \beta <V_A>_{avc}][\partial F/\partial V] \qquad (9)$$

where Eqn 9 is a linear expansion of Eqn 8. Equation 9 is equivalent to Eqn 3 provided the output of the detectors on the focal plane array which serve as inputs to the individual pixels is proportional to the logarithm of the intensity;

$$V_A^{(i)} \alpha \log I_L^{(i)} \qquad (10)$$

where $I_L^{(i)}$ is the intensity of the light incident on the xxxith pixel. Since $V_{out} \alpha \log I_L$ for photovoltaic detectors under open circuit conditions, the logarithmic compression of Eqn 10 is straightforward. Alternatively, sophisticated CCD arrays have been disclosed from which the output from each pixel is a logarithmically compressed function of IL(i) (M. Sayag, U.S. Pat. No. 5,055,667).

Thus, by using the common grid PGT array on the focal plane with the logarithmically compressed output from each detector as the input to each individual PGT, one can directly implement the Mead algorithm expressed in Eqn 3 where $w_i \approx \beta/N$, $N \approx (L/d)^2$ with the spatial decay length L given by Eqn 7, and d equal to the spacing between detectors in the array (equal to the spacing between neighboring PGTs). By controlling the composition of the network, for example by controlling the concentration of PANI in a PANI-based network, one can control the resistivity over many orders of magnitude (Reghu, M., et al, Phys. Rev. B 50, 13931 (1994)). Similarly, by varying the thickness and the resistivity of layer 2 one can vary the conductance of layer 2 over a wide range. Thus, one can vary both $\rho$ and $\sigma$ in Eqn 7 so as to be able to achieve values for L ranging from a few microns to 1 cm.

As previously noted hereinabove, in certain applications it is advantageous to be able to control the characteristic spatial decay length, or "blurring length", L (see Eqn 7), with an applied voltage; for example, so as to match L to the distance over which there are major changes in contrast. As also pointed out this can be done, by replacing the resistive layer, (layer 2 in FIG. 4) with a voltage controlled resistive bilayer 2 plus 2' of FIG. 6. Since the current through a diode increases exponentially with forward bias, $I \alpha \exp[\gamma V]$ (where $\gamma$ is a constant), the resistance of such a polymer diode bilayer decreases as $\exp[-\gamma V]$. Thus by using a polymer diode bilayer 2 plus 2' in place of the layer 2 in FIG. 4, one achieves voltage control of the magnitude of the series resistance ($R_s$, in Eqn. 4), thereby controlling the characteristic spatial decay length, or "blurring length", described in Eqn 7. This voltage control of the characteristic spatial decay or "blurring length" is an advantageous feature of an array of polymer grid triodes with common grid.

The common grid polymer grid triode technology enables the relatively simple fabrication of Smart Polymer Image Processors. The Smart Polymer Focal Plane Processor combines both the series resistance for detector open circuit operation (resulting in direct logarithmic compression) and horizontal current aggregation from the common PANI grid interconnection, with a variety of fabrication advantages. The Smart Polymer Digital Focal Plane is implemented directly on the focal plane (i.e. on the detector array) and connected directly to the detectors prior to analog-to-digital conversion. When used as Smart Polymer Focal Plane Processor, the input to the common grid polymer grid triode array is logarithmically compressed at the detector, since the detector output is proportional to the logarithm of the intensity under the open circuit conditions of the polymer grid triode (a high input impedance device). The common grid polymer grid triode array innovation provides a simple, manufacturable implementation of the horizontal resistive layer as well as simultaneous logarithmic compression of detector output on the top of the detector array with contact pads located in each unit cell for "bump bonding"; i.e. for direct contact to external circuitry. Thus, the Smart Polymer Focal Plane Processor represents the realization of a simple means to achieve local gain control on the focal plane in an application specific process that can be integrated at the detector foundry in a routine manner, similar to that currently used for anti-reflection coatings.

The Smart Polymer Digital Image Processor is, similarly, an array of polymer grid triodes with common grid. The basic structure of the Smart Polymer Digital Image Processor array is the same as that of the Smart Polymer Focal Plane Processor. The two differ in the way they are connected to external circuits. The Smart Polymer Digital Image Processor is integrated directly into the display as a "layer" between the addressable circuitry and the pixels of the display. For example, the liquid crystal display utilizes the common grid polymer grid triode array as both substrate and as input. When used as a Smart Polymer Digital Image Processor, the input to the common grid polymer grid triode array is pre-processed digitally, and logarithmically compressed as digital data.

This invention will be further described by the following examples. These are presented solely to illustrate the practice of various embodiments of this invention and are not to be construed as limiting the scope of the invention defined by the appended claims.

EXAMPLE 1

Eqn 5 can be implemented in the form of a thin film polymer grid triode.

A polymer grid triode 60 in the general configuration of FIG. 5 and the more specific configuration of FIG. 6 was fabricated using the following materials for the indicated layers and constituents:

Substrate: Glass

1st electrode, 1 and 1': ITO/Aluminum. A layer of aluminum was deposited on an ITO coated glass surface.

First active electronic material, 2: Poly(vinyl carbazole), PVK. The PVK film (1400–1500 Å) was cast from cyclopentanone directly onto the aluminum electrode.

Polymer grid electrode, 3: Polyaniline filled with MEH-PPV 3'. The filled network was made in a single step using an initial PANI:PE blend containing 10% PANI. The filled network was fabricated directly onto the PVK layer 2 using the methods described in detail in U.S. patent application Ser. No. 08/227,979.

Third active electronic material, 4: MEH-PPV (1400 Å) was cast onto the filled network, 3 and 3'.

2nd electrode, 5: Gold (Au) metal (500 Å) was deposited onto the third layer by vacuum evaporation. The device was connected such that forward anode-cathode bias corresponded to the anode 1 positive with respect to the Au electrode 5. The conducting polyaniline polymer grid electrode 3 was electrically connected to an external battery circuit such that a voltage was applied between the polymer grid electrode and the first electrode 1. Since this is a single carrier device (as described in U.S. patent application Ser. No. 08/227,979) equation 5a is not valid in the reverse direction.

Figure 7:
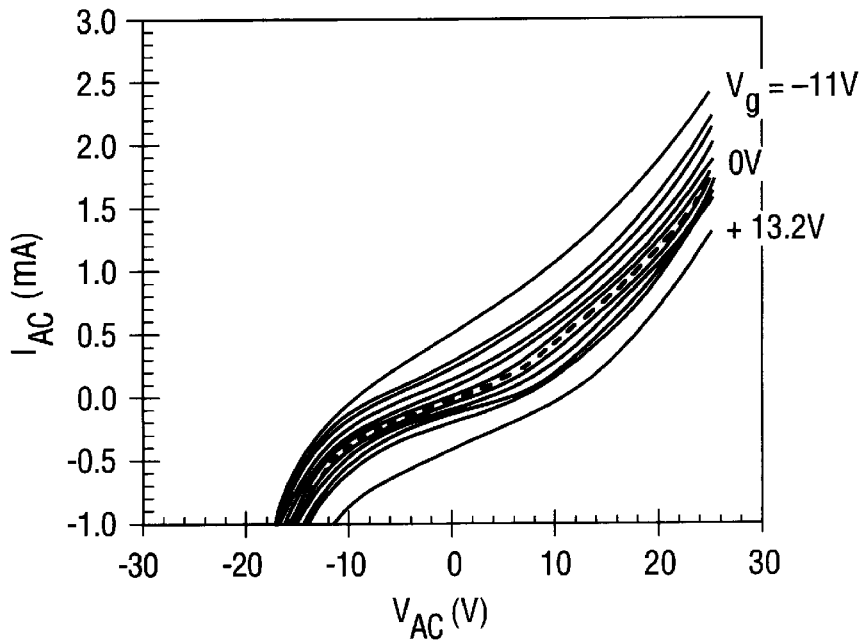
FIG. 7 is a current vs voltage response curve for the device depicted in FIG. 6.

The anode-cathode current vs voltage ($I_{AC}$ vs $V_{AC}$) curves were determined and are shown for different voltages applied between the anode and the network (3rd) electrode, $V_G$, in FIG. 7. Data are shown in FIG. 7 for different $V_G$ ranging from $V_G=-11$ V to $V_G=+13.2$ V. As expected, the I vs VA curves are sensitive to $V_G$; for example at $V_A$ —5 V, $I_A$ can be suppressed from 1 mA to zero (and even made negative) by changing $V_G$.

Similar results were obtained with different series resistance values in the polymer grid circuit (1 MΩ or 100 KΩ). Thus, the three-terminal device can be operated with the polymer grid biased at constant voltage or with the polymer grid drawing significant grid current.

Figure 8:
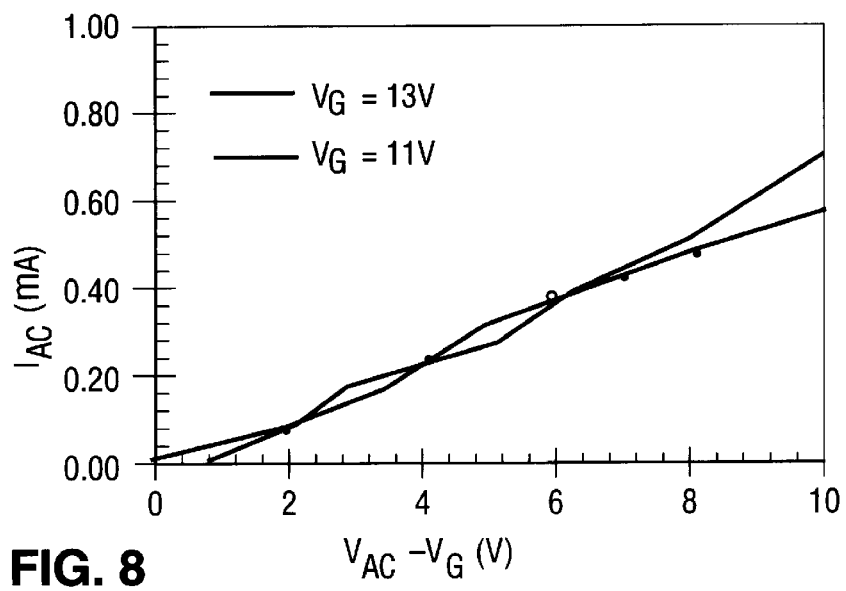
FIG. 8 is a pair of curves for the limiting data sets of FIG. 7 replotted as a function of $(V_A-V_G)$.

In FIG. 8, the curves from the limiting data sets ($V_G=-11$ V and $V_G=+13.2$ V) are plotted as a function of the difference voltage, ($V_A-V_G$). Since all the forward bias data collapse onto a single curve, Eqn 5b is indeed valid.

This Example demonstrated that the current through the polymer grid triode device is a function of ($V_A-V_G$). Since all the forward bias data collapse onto a single curve, Eqn 5b is valid, and the polymer grid triode can be used to implement the logarithmic local contrast enhancement algorithm (equation 3).

EXAMPLE 2

A polymer grid triode array, with four triodes on a single substrate all with a common grid, was fabricated. The structure of the array is shown schematically as 90 in FIG. 9. The fabrication process for this triode array is similar to that of a single polymer grid triode, as described in Example 1. In fabricating the array, the principal difference was that there are separate contact pads 5, 5a, 5b, etc providing an anode and a cathode for each device in the array. The semiconducting layers, 2, 3' and 4, and the PANI-based polymer grid, 3, were continuous layers common to all the PGTs within the array (see FIG. 9). In this structure 10 is a glass substrate, 1 is an aluminum over ITO electrode, 2 is 1500 Å of MEH, 3 is MEH-filled PANI grid, and 4 is 1400 Å of MEH, 5 is a calcium electrode.

For the array 90 described in this Example, the bulk resistance of each of the MEH-PPV layers at low bias was approximately 20 Megohms; this resistance dropped to less than 2000 ohms after the onset of tunneling injection. The sheet resistance of the PANI horizontal resistance network was approximately 20,000 ohms.

Figure 10:
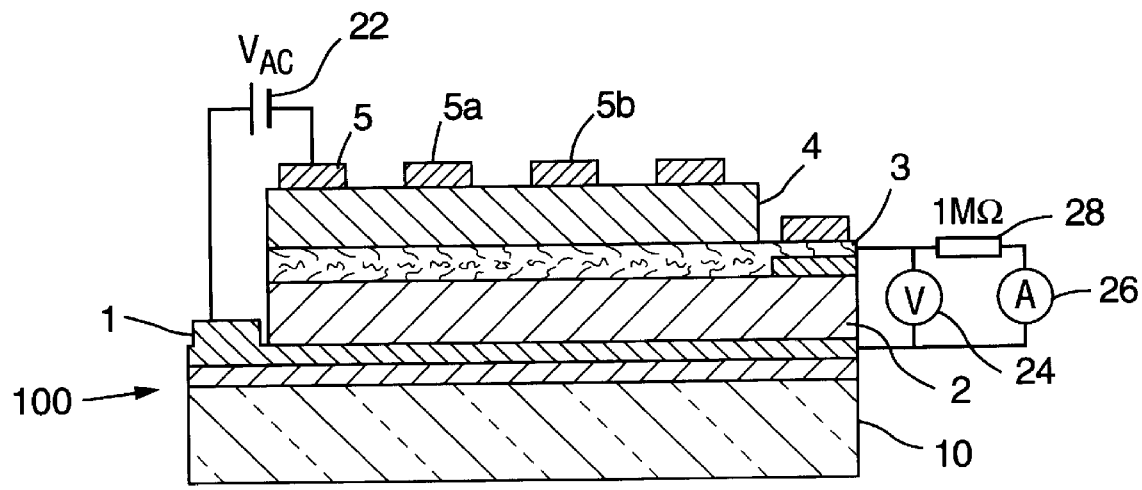
FIG. 10 is a cross-sectional schematic view of a polymer grid triode-based array of this invention illustrating a diagram of the circuit used to determine voltage and current characteristics for the array.
Figure 11:
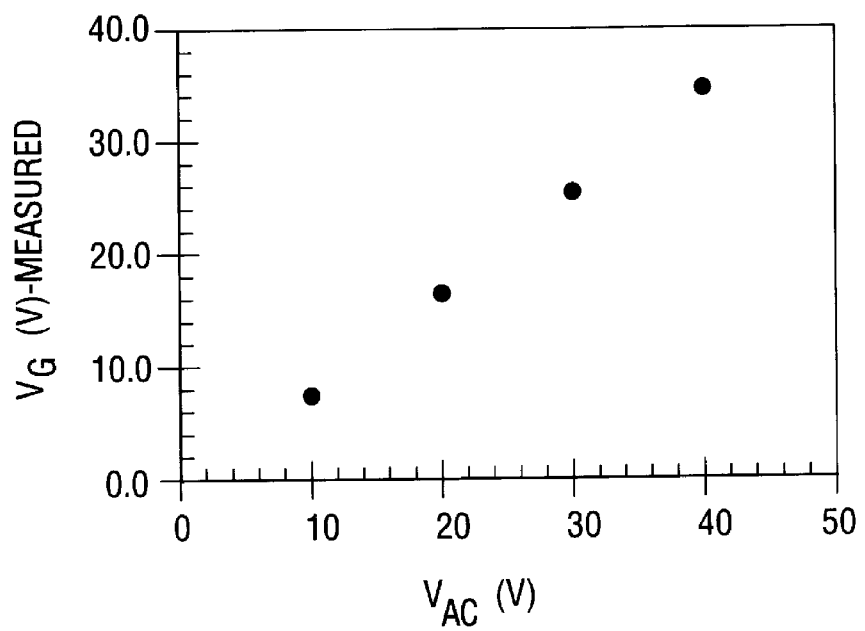
FIG. 11 is a graph illustrating the voltage between the common grid and the anode of the array of FIG. 10.

The voltage of the common-grid 3 with respect to the anode 1 (Al, in this Example) was measured while a voltage was applied between the anode 1 and the cathode 5. The circuit diagram for the measurement is shown as 100 in FIG. 10. As indicated $V_{AC}$, the applied voltage between the anode and the cathode, is supplied from source 22 applied on the left-most triode defined by electrodes 1 and 5. A voltage meter 24 and current meter 26 plus current limiting resistor 28 were used to measure the voltage and current between the common grid 3 and the right-most (most distant from anode 1 anode. The voltage of the common grid 3 with respect to the right-most anode, anode 1c, was measured and is plotted in FIG. 11. As the $V_{AC}$ increased, the voltage on the grid ($V_G$) at a neighboring position (a few mm away) also increased.

The IV characteristics for individual triode from the array were measured; the different devices showed good reproducibility with typical data as shown in U.S. patent application Ser. Nos. 08/218,321; 08/227,979 and 08/292,817 now U.S. Pat. No. 5,563,424 and in Nature 372, 244 (1994).

This example demonstrated that an array of polymer grid triodes can be fabricated with a common grid, and that the grid voltage at a neighboring position (a few mm away; see FIG. 10) responds in proportion to the applied voltage between the anode and the cathode ($V_{AC}$). This response of the common grid polymer grid triode is equivalent to that described mathematically by equation 6.

EXAMPLE 3

This example demonstrates that the common grid polymer grid triode is capable of implementing local contrast control using a simplified monolithic conducting polymer device which can be mounted directly on the focal plane (i.e. connected directly to an array of detectors on the focal plane) in a manner analogous to that which is currently used for anti-reflection coatings.

Figures 1, 2, 3:
FIG. 1 is an actual 8 bit image of Dr. Einstein.
FIG. 2 is the same image as in FIG. 1 multiplied by a ramp of intensity (smoothly increasing from 1 on his right to 256 on his left) and then divided by 256.
FIG. 3 is the same image as in FIG. 1 multiplied by a rounded step function (increasing as a step from 1 on his left to 256 on his right) and then divided by 256.
Figures 12, 13, 14:
FIG. 12 is the result of renormalizing FIG. 1 by Eqn 3 using N=100 (i.e. the output of each pixel is normalized to the average of a 10×10 array of its neighbors).
FIG. 13 is the result of renormalizing FIG. 2 by Eqn 3 using N=100 (i.e. the output of each pixel is normalized to the average of a 10×10 array of its neighbors).
FIG. 14 is the result of renormalizing FIG. 3 by Eqn 3 using N=100 (i.e. the output of each pixel is normalized to the average of a 10×10 array of its neighbors).
Figure 9:
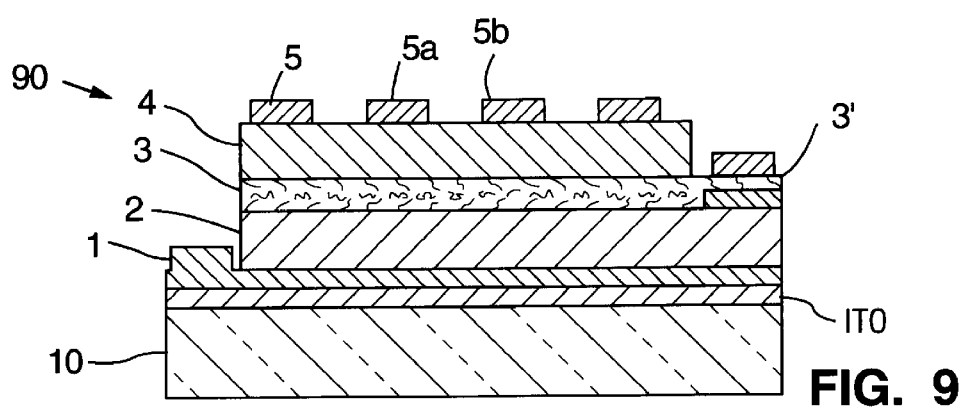
FIG. 9 is simplified cross-sectional view of an array of four polymer grid triodes with a common grid.

The validity of Eqn 5b, as demonstrated in Example 1, provided the basic proof that Eqn 3 can be implemented directly by the common grid polymer grid triode array shown in FIGS. 5 and 6. The effect of processing the images in FIGS. 1, 2 and 3 with the Mead local contrast enhancement algorithm (Eqn 3) is shown in FIG. 9. FIGS. 12, 13 and 14. FIG. 12 was obtained by renormalizing FIG. 1 by Eqn 3 using N=100 (i.e. the output of each pixel is normalized to the average of a 10×10 array of its neighbors). Although there is some loss of resolution, FIG. 12 is a clear image of Einstein. FIG. 13 was obtained by renormalizing FIG. 2 using Eqn 3; after this image processing, the entire image can be seen on the limited range display. FIG. 14 was obtained by renormalizing FIG. 3 using Eqn 3; again the entire image can be seen on the limited range display after image processing. The slight "overshoot" in the center of FIG. 14 (near the contrast edge in FIG. 14) can be further softened by better matching the spatial averaging to the distance over which the background intensity changes in the rounded step function, as described in the paragraphs following Eqn (7). The ability to match the spatial averaging distance (see Eqn 7) to the distance over which the background intensity changes, is a principal advantage of the common grid polymer grid triode array.

The image processing illustrated by FIGS. 13 and 14 demonstrated clearly the power of local contrast control. By implementing local gain adjustment, the entire dynamic range of the image was captured for subsequent image processing and/or presentation on a typical limited range display; local contrast enhancement was utilized to solve the intra-scene contrast problem.

This Example demonstrates that the logarithmic local contrast enhancement algorithm solves the local contrast enhancement problem. This example, therefore, specifically demonstrates the utility of the common grid polymer grid triode array as a local contrast enhancement converter: the data from an image are logarithmically compressed in digital form and then processed by the algorithm which is implemented directly by the common grid polymer grid triode array as demonstrated in Examples 1 and 2.

We claim:

1. A triode array comprising at least one first electrode and a plurality of second electrodes, said plurality of second electrodes being spatially arrayed and electrically isolated from one another, said at least one first electrode and said plurality of second electrodes spaced apart from one another by a layer of solid semiconductor and a common polymer grid, said common polymer grid comprising a body of electrically conducting organic polymer, said body having an open and porous network morphology with void spaces therebetween and interposed between the at least one first electrode and the plurality of second electrodes.

2. The triode array of claim 1 wherein the solid semiconductor comprises active electronic material between the first and second electrodes.

3. The triode array of claim 2 wherein active electronic material is present within at least a portion of the void spaces defined by the open and porous network of the body.

4. The triode array of claim 3 comprising active electronic material between at least one of the first and second electrodes and the polymer grid.

5. The triode array of claim 1 additionally comprising an electrical connector in electrical connection to said body.

6. The triode array of claim 1 comprising at least one first electrode having a surface having a length and width, a first layer of active electronic material in electrical contact with at least a substantial portion of said surface of said at least one first electrode, a common polymer grid comprising a body of electrically conducting organic polymer, said body having an open and porous network morphology with void spaces therebetween, and said active electronic material present within at least a portion of the void spaces, said polymer grid having a surface and being in electrical contact with at least a substantial portion of said surface of said first layer, a second layer of said active electronic material in electrical contact with at least a substantial portion of said surface of said common polymer grid, and a plurality of second electrodes, said plurality of second electrodes being spatially arrayed over at least a portion of the area defined by the length and width of the first electrode, said plurality of second electrodes electrically isolated from one another and spaced apart from one another and in electrical contact with said second layer of active material.

7. The triode array of claim 6 additionally comprising an electrical connector in electrical connection to said body.

8. The triode array of claim 1 comprising a plurality of first electrodes and a plurality of second electrodes, said plurality of first electrodes being spatially arrayed and electrically isolated from one another, said plurality of second electrodes being spatially arrayed and electrically isolated from one another, with said plurality of first electrodes and said plurality of second electrodes spaced apart from one another by said layer of solid semiconductor and said common polymer grid interposed between the plurality of first electrodes and the plurality of second electrodes.

9. The triode array of claim 8 additionally comprising active electronic material between the first and second electrodes and within at least a portion of the void spaces defined by the open and porous network of the body.

10. The triode array of claim 9 additionally comprising an electrical connector in electrical connection to said body.

11. The triode array of claim 1 comprising a plurality of first electrodes, said plurality of first electrodes being spatially arrayed and electrically isolated from one another over a surface having a length and width, a first layer of active electronic material in electrical contact with at least a substantial portion of said surface of said first electrodes, said active electronic material present within at least a portion of said void spaces, said common polymer grid having a surface and being in electrical contact with at least a substantial portion of said surface of said first layer a second layer of said active electronic material in electrical contact with at least a substantial portion of said surface of said common polymer grid, and a plurality of second electrodes, said plurality of second electrodes being spatially arrayed over at least a portion of the area defined by the length and width of the plurality of first electrodes, said plurality of second electrodes electrically isolated from one another and spaced apart from one another and in electrical contact with said second layer of active material.

12. The triode array of claim 11 additionally comprising an electrical connector in electrical connection to said body.

13. The triode array of claim 1 as an electronic neural simulation network comprising a plurality of electrically isolated diodes in an array with a horizontal resistance network providing a degree of interconnection among the plurality of diodes, the improvement comprising common polymer grid as the horizontal resistance network.

14. An array comprising a plurality of polymer grid triodes, each said polymer grid triodes having a first active layer and a second active layer separated from one another by a polymer grid, with one of said first and second active layers comprising a high resistance conducting polymer with sufficiently high conductivity to form an ohmic contact with the polymer grid with the grids of said plurality of polymer grid triodes being joined into a common polymer grid.

15. The triode array of claim 14 further comprising at least one first electrode having a surface having a length and width, said first active layer of active electronic material in electrical contact with at least a substantial portion of said surface of said at least one first electrode, said common polymer grid comprising a body of electrically conducting organic polymer, said body having an open and porous network morphology with void spaces therebetween, with active electronic material present within at least a portion of the void spaces, said polymer grid having a surface and being in electrical contact with at least a substantial portion of said surface of said first active layer said second active layer of active electronic material in electrical contact with at least a substantial portion of said surface of said common polymer grid, and a plurality of second electrodes, said plurality of second electrodes being spatially arrayed over at least a portion of the area defined by the length and width of the at least one first electrode, said plurality of second electrodes electrically isolated from one another and spaced apart from one another and in electrical contact with said second layer of active material, thereby giving rise to a circuit equivalent to a diode in series with a resistor.

16. The triode array of claim 15 wherein the first layer is the high resistance active layer.

17. The triode array of claim 15 wherein the second layer is the high resistance active layer.

18. The triode array of claim 14 comprising a plurality of first electrodes, said plurality of first electrodes being spatially arrayed and electrically isolated from one another over a surface having a length and width, said first active layer of active electronic material in electrical contact with at least a substantial portion of said surface of said first electrodes, said polymer grid comprising a body of electrically conducting organic polymer, said body having an open and porous network morphology with void spaces therebetween with active electronic material present within at least a portion of the void spaces, said polymer grid having a surface and being in electrical contact with at least a substantial portion of a surface of said first layer said second active layer of active electronic material in electrical contact with at least a substantial portion of said surface of said polymer grid, and a plurality of second electrodes, said plurality of second electrodes being spatially arrayed over at least a portion of the area defined by the length and width of the first electrodes, said plurality of second electrodes electrically isolated from one another and spaced apart from one another and in electrical contact with said second layer of active material, thereby giving rise to a circuit equivalent to a diode in series with a resistor.

19. The triode array of claim 18 wherein the first layer is the high resistance active layer.

20. The triode array of claim 18 wherein the second layer is the high resistance active layer.

21. In an array of polymer grid triodes each having a first layer and a second layer separated from one another by a polymer grid, the improvement comprising the first layer comprising an electronically active material and the second layer comprising a high resistance bilayer with sufficiently high conductivity to form an ohmic contact with the polymer grid, with the polymer grid providing a common grid among the triodes in the array.

22. In an array of polymer grid triodes each having a first layer and a second layer separated from one another by a polymer grid, the improvement comprising the second layer comprising an electronically active material and the first layer comprising a high resistance bilayer with sufficiently high conductivity to form an ohmic contact with the polymer grid, with the polymer grid providing a common grid among the triodes in the array.

23. A triode array comprising at least one first electrode and a plurality of second electrodes, said plurality of second electrodes being spatially arrayed and electrically isolated from one another, said at least one first electrode and said plurality of second electrodes spaced apart from one another by solid semiconductor with a common polymer grid comprising a body of electrically conducting organic polymer, said body having an open and porous network morphology with void spaces therebetween and interposed between the first electrodes and the plurality of second electrodes, with said common polymer grid as a horizontal resistance network among the individual triodes in said array and said triode array having a characteristic spatial decay length.

24. The triode array of claim 23 wherein the characteristic spatial decay length is dependent upon the conductance/resistance of the common polymer grid.

25. The triode array of claim 24 wherein the characteristic spatial decay length is dependent upon the sheet resistance of the common polymer grid.

26. The triode array of claim 25 wherein the sheet resistance of the common polymer grid is dependent upon the composition of the electrically conducting organic polymer in the common polymer grid.

27. The triode array of claim 25 wherein the sheet resistance of the common polymer grid is dependent upon the thickness of the common polymer grid.

28. A method for varying the spatial decay length of the triode array of claim 23 comprising varying the conductance/resistance of the common polymer grid.

29. A method for varying the spatial decay length of the triode array of claim 23 comprising varying the sheet resistance of the common polymer grid.

30. The method of claim 29 wherein the sheet resistance of the common polymer grid is varied by varying the composition of the electrically conducting organic polymer in the common polymer grid.

31. The method of claim 30 wherein the varying of the composition of the electrically conducting organic polymer is effected by blending the electrically conducting polymer with polymer having different electrical conductance properties.

32. The method of claim 29 wherein the sheet resistance of the common polymer grid is varied by varying the thickness of the common polymer grid.

33. An array of polymer grid triodes each having a first active layer and a second active layer separated from one another by a common polymer grid, the improvement comprising one of the first and the second active layers comprising a high resistance conducting polymer with sufficiently high conductivity to form an ohmic contact with the grid, with said common polymer grid as a horizontal resistance network among the individual triodes in said array and said triode array having a characteristic spatial decay length.

34. The triode array of claim 33 wherein the characteristic spatial decay length is dependent upon the conductance/resistance of the common polymer grid.

35. The triode array of claim 34 wherein the characteristic spatial decay length is dependent upon the sheet resistance of the common polymer grid.

36. The triode array of claim 35 wherein the sheet resistance of the common polymer grid is dependent upon the composition of the electrically conducting organic polymer in the common polymer grid.

37. The triode array of claim 35 wherein the sheet resistance of the common polymer grid is dependent upon the thickness of the common polymer grid.

38. A method for varying the spatial decay length of the triode array of claim 33 comprising varying the sheet resistance of the common polymer grid.

39. The triode array of claim 33 wherein the characteristic spatial decay length is dependent upon the sheet resistance of the active layer comprising a high resistance conducting polymer.

40. The triode array of claim 34 wherein the sheet resistance of the active layer comprising a high resistance conducting polymer is dependent upon the composition of the high resistance conducting polymer.

41. The triode array of claim 39 wherein the sheet resistance of the active layer comprising a high resistance conducting polymer is dependent upon the thickness of the layer.

42. A method for varying the spatial decay length of the triode array of claim 39 comprising varying the conductance/resistance of the active layer comprising a high resistance conducting polymer.

43. The method of claim 42 wherein the varying of the conductance/resistance of the active layer comprising a high resistance conducting polymer is effected by varying of the composition of the active layer comprising a high resistance conducting polymer.

44. The method of claim 43 wherein the varying of the composition of the active layer comprising a high resistance conducting polymer is effected by blending the high resistance conducting polymer with a polymer having different electrical conductance properties.

45. A light-responsive triode array smart polymer focal plane image processor comprising a plurality of first electrodes spatially arrayed and electrically isolated from one another over a surface having a length and width and a plurality of second electrodes, said plurality of second electrodes being spatially arrayed and electrically isolated from one another, with said first electrodes and said plurality of second electrodes spaced apart from one another, a common polymer grid comprising a body of electrically conducting organic polymer, said body having an open and porous network morphology with void spaces therebetween and interposed between the first electrodes and the second electrodes, a photovoltaic semiconducting material between the first and second electrodes so that when an effective voltage-generating light source is applied to said semiconducting material a detectable voltage is generated across individual triodes comprising a first electrode and a second electrode and said common polymer grid providing a horizontal resistance network among the individual triodes in the array interrelating the detectable voltages generated across the individual triodes.

46. The light-responsive triode array smart polymer focal plane image processor of claim 45 wherein the photovoltaic semiconducting material is present between the first electrodes and the common polymer grid and between the common polymer grid and the second electrodes.

47. The light-responsive triode array smart polymer focal plane image processor of claim 45 wherein the photovoltaic semiconducting material is present within at least a portion of the void spaces defined by the open and porous network of the body.

48. A light-responsive triode array smart polymer digital image processor comprising a plurality of first electrodes spatially arrayed and electrically isolated from one another over a surface having a length and width and a plurality of second electrodes, said plurality of second electrodes being spatially arrayed and electrically isolated from one another, said first electrodes and said plurality of second electrodes spaced apart from one another, a common polymer grid comprising a body of electrically conducting organic polymer, said body having an open and porous network morphology and void spaces therebetween and interposed between the first electrodes and the second electrodes, a photovoltaic semiconducting material between the first and second electrodes so that when an effective voltage generating light source is applied to said semiconducting material a detectable voltage is generated across individual triodes comprising a first electrode a second electrode and said common polymer grid interrelating the detectable voltages generated across the individual triodes, which voltages are digitally processed.

49. In an image processor which comprises a plurality of optical sensors spatially arrayed over an area upon which an image of variable light intensity is projected thereby giving rise to different electrical outputs from optical sensors depending upon the light intensity, the improvement comprising employing the light-responsive triode array of claim 48 as the plurality of optical sensors.

50. A light-emitting triode array comprising a plurality of first electrodes spatially arrayed and electrically isolated from one another over a surface having a length and width and a plurality of second electrodes spatially arrayed and electrically isolated from one another, said first electrodes and said second electrodes spaced apart from one another with a common polymer grid comprising a body of electrically conducting organic polymer, said body having an open and porous network morphology with void spaces therebetween and interposed between the first electrodes and the second electrodes, an electroluminescent semiconducting material between the first and second electrodes so that when an effective turn-on voltage is applied across at least one of said first electrodes and at least one of said second electrodes, charge carriers are injected into said electroluminescent semiconducting material in those regions therebetween and light is emitted from those regions.

51. In an optical image display which comprises a plurality of light-emitting electrical-input-driven display elements spatially arrayed over an area upon which an image is displayed and a source of a plurality of differential electrical inputs for the plurality of light-emitting display elements to create an optical image, the improvement comprising employing the light-emitting triode array of claim 50 as the plurality of light-emitting electrical-input-driven display elements.

* * * * *